United States Patent [19]

Shoki

[11] Patent Number: 5,989,755

[45] Date of Patent: Nov. 23, 1999

[54] METHOD OF MANUFACTURING X-RAY MASK BLANK AND METHOD OF MANUFACTURING X-RAY MEMBRANE FOR X-RAY MASK

[75] Inventor: Tsutomu Shoki, Hachioji, Japan

[73] Assignee: Hoya Corporation, Japan

[21] Appl. No.: 09/052,464

[22] Filed: Mar. 31, 1998

[30] Foreign Application Priority Data

Mar. 31, 1997 [JP] Japan ................................. 9-080758

[51] Int. Cl.$^6$ ....................................................... G03F 9/00
[52] U.S. Cl. ................................................. 430/5; 378/35
[58] Field of Search ................................ 430/5; 378/34, 378/35; 428/432

[56] References Cited

U.S. PATENT DOCUMENTS

| | | | |
|---|---|---|---|
| 5,005,075 | 4/1991 | Kobayashi et al. | 378/35 |
| 5,178,977 | 1/1993 | Yamada et al. | 378/35 |

FOREIGN PATENT DOCUMENTS 7-75219  8/1995  Japan .

OTHER PUBLICATIONS

English language abstract: Japanese Laid–Open Patent No. 7–75219. Aug. 1995.

Yamaguchi, Y.I. et al, "Properties of Si.c. Film as X–Ray Mask Membrane," Materials Research Laboratory, Hoya Corporation, pp. 197–210.

*Primary Examiner*—S. Rosasco
*Attorney, Agent, or Firm*—Cook, Alex, McFarron, Manzo, Cummings & Mehler Ltd.

[57] ABSTRACT

Disclosed is a method comprising the step of checking a defect on a surface of a thin film formed by a step or steps of forming the thin film to be an x-ray membrane 12, wherein the thin film is formed by the thin film forming step or steps so that the thin film checked by the defect checking step may have a surface roughness of 1.0 nm or less in terms of Ra (center-line average roughness).

6 Claims, 6 Drawing Sheets

FIG. 1

X-RAY MASK

FIG. 2

X-RAY MASK BLANK

METHOD OF MANUFACTURING X-RAY MASK BLANK AND METHOD OF MANUFACTURING X-RAY MEMBRANE FOR X-RAY MASK

REFERENCE TO RELATED APPLICATION

This application claims the priority right under 35 U.S.C 119, of Japanese Patent Application No. Hei 09-80758 filed on Mar. 31, 1997, the entire disclosure of which is incorporated herein by reference.

BACKGROUND OF THE INVENTION

1. Field of the Invention

The present invention relates to a method of manufacturing an x-ray mask blank which is a material of an x-ray mask used as a mask in an x-ray lithography method and a method of manufacturing an x-ray membrane for the x-ray mask.

2. Description of the Related Art

In a semiconductor industry, as a technique for forming an integrated circuit constituted of a fine pattern on a silicon substrate or the like, a photolithography method for transferring the fine pattern by the use of a visible light and an ultraviolet light as an exposing electromagnetic wave is well known. However, a recent advance in a semiconductor technique greatly promotes a high integration of a semiconductor device such as VLSI, and this results in a requirement for the technique for transferring the fine pattern with high accuracy beyond a transfer limit (a principled limit due to a wavelength) of the visible light and the ultraviolet light for use in the conventional photolithography method. In order to transfer such a fine pattern, an x-ray lithography method using an x-ray whose wavelength is shorter than the wavelength of the visible light and the ultraviolet light is attempted.

Figure 1:
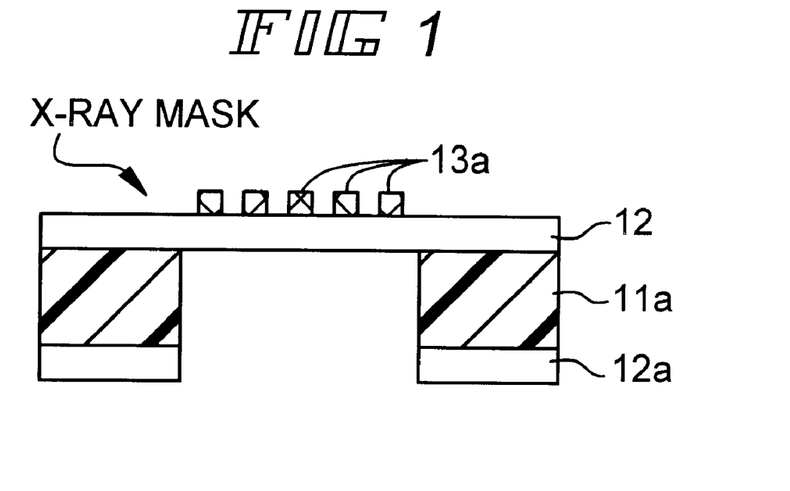
FIG. 1 is a cross sectional view for describing a structure of an x-ray mask.
Figure 2:
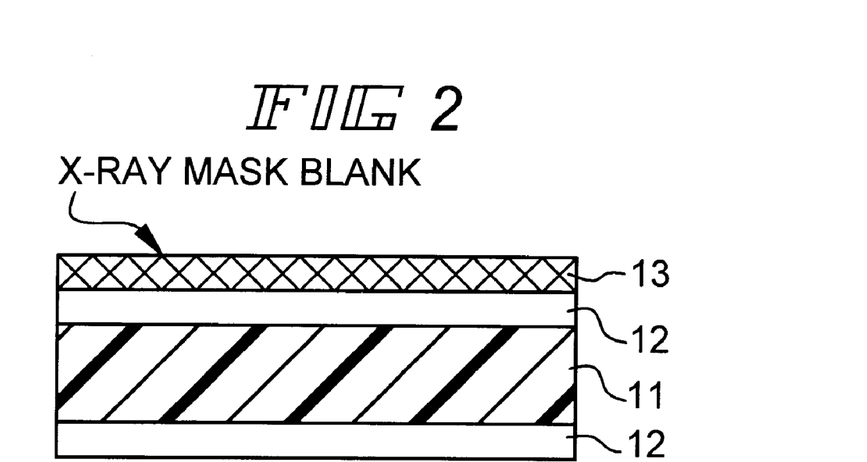
FIG. 2 is a cross sectional view for describing the structure of an x-ray mask blank.

FIG. 1 is a cross sectional view showing a structure of an x-ray mask for use in the x-ray lithography. FIG. 2 is a cross sectional view showing the structure of an example of an x-ray mask blank as an intermediate product obtained in an intermediate process during manufacturing the x-ray mask.

As shown in FIG. 1, an x-ray mask 1 comprises an x-ray membrane 12 for transmitting the x-ray and an x-ray absorbing film pattern 13a formed on the x-ray membrane 12. The x-ray membrane 12 is supported by a silicon frame body 11a which is formed by removing the other portion so that the periphery alone of the silicon substrate may remain. When this x-ray mask 1 is manufactured, the x-ray mask blank to be the intermediate product is manufactured in the intermediate process. This x-ray mask blank is further processed, so that the x-ray mask is obtained. In this industry, although, of course, the x-ray mask which is a finished product is to be dealt in, the x-ray mask blank which is the intermediate product is also often to be independently dealt in.

As shown in FIG. 2, an x-ray mask blank 2 comprises the x-ray membrane 12 formed on a silicon substrate 11 and an x-ray absorbing film 13 formed on the x-ray membrane.

Silicon nitride, silicon carbide, diamond or the like is generally used as the x-ray membrane 12. An amorphous material including tantalum (Ta) having an excellent resistance to x-ray radiation is often used as the x-ray absorbing film 13.

For the process of manufacturing the x-ray mask 1 from the x-ray mask blank 2, for example, the following method is used. That is, a resist film on which a desired pattern is formed is arranged on the x-ray mask blank 2 shown in FIG. 2. This pattern is then used as a mask so as to perform a dry etching, so that the x-ray absorbing film pattern is formed. After that, a center area formed on a rear surface and to be a window area of the x-ray membrane 12 is removed by a reactive ion etching (RIE) using 4-fluorocarbon ($CF_4$) as etching gas. The remaining film (12a: see FIG. 1) is then used as the mask so as to etch the silicon by an etching liquid constituted of a mixed liquid of fluoric acid and nitric acid, whereby the x-ray mask 1 (see FIG. 1) is obtained. In this case, an electron beam (EB) resist is generally used as the resist, and the pattern is formed by means of an EB lithography.

For the x-ray membrane 12, a high transmittance to the x-ray, a high Young's modulus of elasticity, a proper tensile stress, a resistance to x-ray radiation, the high transmittance within a visible light range and the like are required. The characteristics will be described below. The transmittance to the x-ray is required during an exposure. The higher the transmittance is, the shorter a time required for the exposure can become. This is effective for improving throughput. The Young's modulus of elasticity has an influence on a strength of the film and a deformation of an absorber pattern. The higher the Young's modulus of elasticity is, the higher the film strength becomes. This is effective for suppressing misalignment. The proper tensile stress is needed in order that the film is self-supported. The resistance to x-ray radiation is required to cause no damage due to the x-ray radiation, because the x-ray membrane is irradiated with the x-ray during the exposure. As regards the transmittance within the visible light range, since an alignment of the mask attached to an x-ray stepper and a wafer is accomplished by the use of a light source within the visible light range, the high transmittance to an alignment light source is needed in order to achieve a highly accurate alignment. Furthermore, a film surface is required to be smooth. A surface smoothness is needed for a highly accurate pattern formation on the absorber.

In order to satisfy these requirements, various materials and manufacturing methods have been studied. Since it is confirmed that the silicon carbide has the highest Young's modulus of elasticity and causes no damage due to the x-ray in the silicon nitride, the silicon carbide (SiC) and the diamond which have been heretofore used as the x-ray membrane, it may safely be said that the silicon carbide is the most promising material. However, since the SiC film for the general use has a polycrystalline structure, the SiC film has the film surface which is rougher than 6 nm (Ra: a center-line average roughness) due to a crystalline structure. For smoothing of the surface of this SiC film, an etch back method and a mechanical polishing method are carried out after the film formation. The etch back method is the technique in which the rough SiC film is coated with the resist and the thus obtained smooth resist surface is transferred onto the SiC film by the dry etching. The mechanical polishing is the method in which a hard grain such as the diamond and alumina is used as an abrasive material so as to physically grind an unevenness on the surface of the SiC film. For example, according to Japanese Patent Publication No. 7-75219, the surface roughness of 20 nm or less is obtained by the etch back and the mechanical polishing. Although a definition of the surface roughness is not clear in this publication, this roughness is expected to be a maximum height (Rmax) and corresponds to about 2 nm or less in terms of Ra.

Recently, due to the advance in the photolithography technique, an introduction of the x-ray lithography has been performed later. At present, the introduction from a generation of 1 G bit-DRAM (design rule: 0.18 $\mu$m) is anticipated.

Even if the x-ray lithography is introduced from 1 G, the x-ray lithography is characterized by that it can be used through a plurality of generations up to 4 G, 16 G and 64 G. Assuming that the x-ray lithography is used for 64 G, a position precision required for the x-ray mask becomes severer, and the position precision is required to be as high as 10 nm. Furthermore, a mask pattern is required to have no defect regardless of a pattern size. Although the pattern defect can be corrected by a defect correcting unit, the number of practically correctable defects is limited to about 10 or less on the mask surface. A factor of the pattern defect is mainly caused due to the defect of the x-ray absorbing film, and more specifically, the important factor is the defect of the x-ray membrane. That is, if the defect (a contaminant or the like) is caused on the membrane, the defect is also inherited on the absorbing film formed on the membrane. Moreover, this faulty absorbing film causes the pattern defect after a mask processing. Therefore, it is necessary to exactly check the defect on the x-ray membrane and to process so that no defect or the least defect may be on the membrane. Furthermore, as regards the thin film such as an etching stop layer and a reflection preventing film formed as a sublayer of the x-ray absorbing film or the thin film such as an etching mask layer formed as a top layer of the x-ray absorbing film, since a presence of the defect on these thin films causes the pattern defect, it is necessary to check whether or not the defect is on these thin films. A minimum size of the defect affecting the pattern defect corresponds to a width of a minimum line of the pattern. Therefore, in case of the x-ray mask, it is necessary to exactly check the defect size of about 0.2 $\mu$m. As a defect checking unit, the method of detecting a light scattering from the surface defect by the use of a laser light is generally used. For example, by Surfscan 6220 (KLA-Tencor), a minimum sensitivity of 0.09 $\mu$m can be realized on a silicon wafer. However, in such a surface defect checking unit using the laser light, the detecting sensitivity to the defect is sensitively influenced by the surface roughness. Therefore, if the surface is rough, the roughness causes the light to be scattered, and thus the fine defect cannot be disadvantageously recognized (distinguished).

SUMMARY OF THE INVENTION

It is therefore an object of the present invention to provide a method of manufacturing an x-ray mask blank capable of obtaining the x-ray mask blank available for a material during manufacturing an x-ray mask capable of a highly precise pattern transfer.

Another object of the present invention is to provide a method of manufacturing a x-ray membrane for the x-ray mask.

In accordance with the first aspect of the present invention, there is provided a method of manufacturing an x-ray mask blank comprising one step or two steps or more of forming a thin film including at least an x-ray membrane on a substrate, the method which comprises the step of: checking a defect on a surface of the thin film formed by the thin film forming step or steps, wherein the thin film is formed by the thin film forming step or steps so that the thin film checked by the defect checking step may have a surface roughness of 1.0 nm or less in terms of Ra (center-line average roughness).

In accordance with the second aspect of the present invention, there is provided a method according to the first aspect, wherein the thin film forming step or steps includes/include a step of flattening the surface of the thin film.

In accordance with the third aspect of the present invention, there is provided a method according to the first or second aspect, wherein the surface flattening step is for polishing the surface of the thin film.

In accordance with the fourth aspect of the present invention, there is provided a method according to any one of the first through third aspects, wherein the x-ray membrane comprises silicon carbide.

In accordance with the fifth aspect of the present invention, there is provided a method according to any one of the first through fourth aspects, wherein the defect checking step is for checking the surface defect by the method using a surface scattering by the use of a laser light.

In accordance with the sixth aspect of the present invention, there is provided a method of manufacturing an x-ray membrane for an x-ray mask comprising the step of: checking a defect on a surface of a thin film formed by a step or steps of forming the thin film to be the x-ray membrane, wherein the thin film is formed by the thin film forming step or steps so that the thin film checked by the defect checking step may have a surface roughness of 1.0 nm or less in terms of Ra (center-line average roughness).

The inventor has repeated experiments as to the surface roughness and a size of the defect to be detected. As a result, in order to exactly evaluate the defect of about 0.2 $\mu$m, it is seen that the surface roughness on the surface to be checked is required to be 1.0 nm (Ra) or less. This results in the present invention. The principle will be described below.

Figure 4:
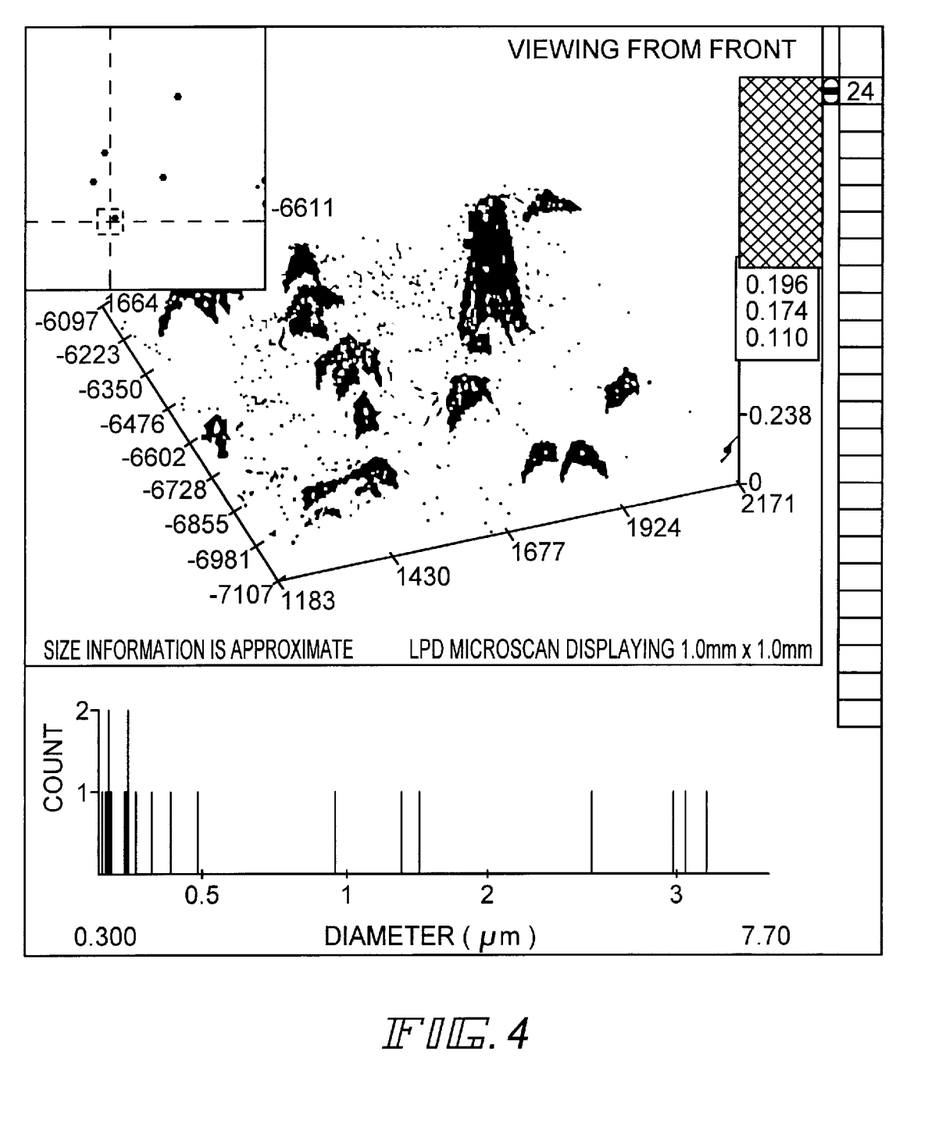
FIG. 4 shows a micro scan image of a surface of an x-ray membrane of Ra=0.5 nm or less.
Figure 5A:
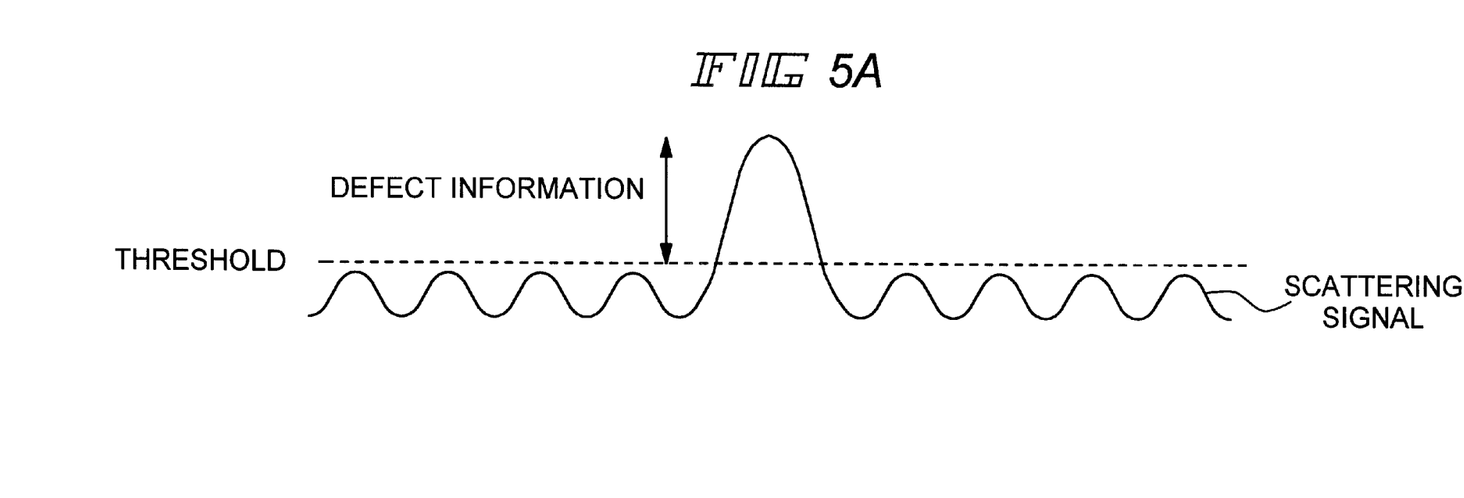
FIG. 5(a) typically shows the micro scan image of the surface of the x-ray membrane of Ra=0.5 nm or less observed from the just side.
Figure 5B:
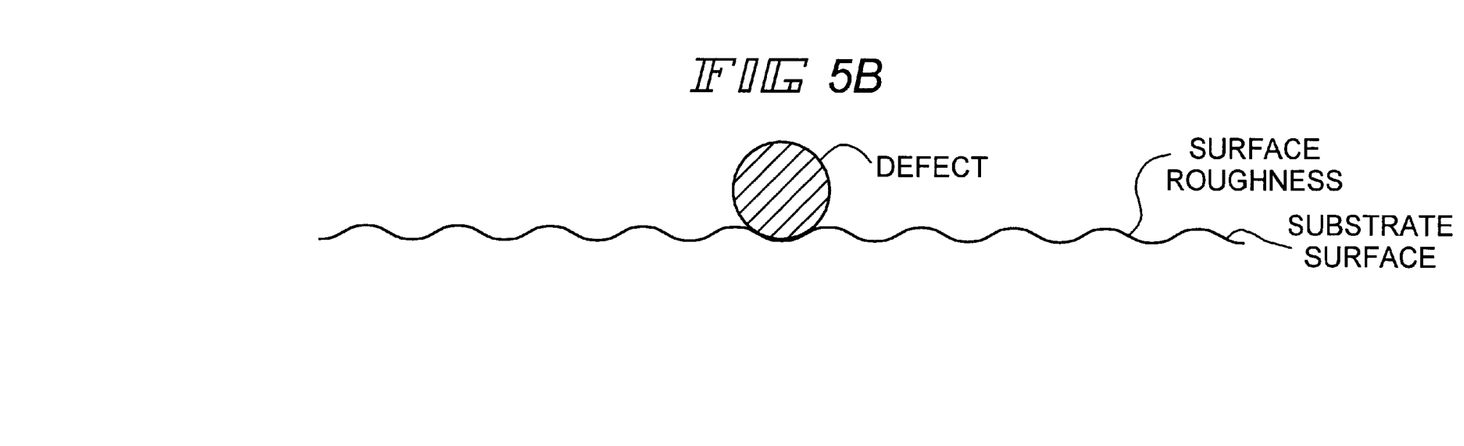
FIG. 5(b) typically shows a cross section of the surface of the x-ray membrane of FIG. 5(a)
Figure 6:
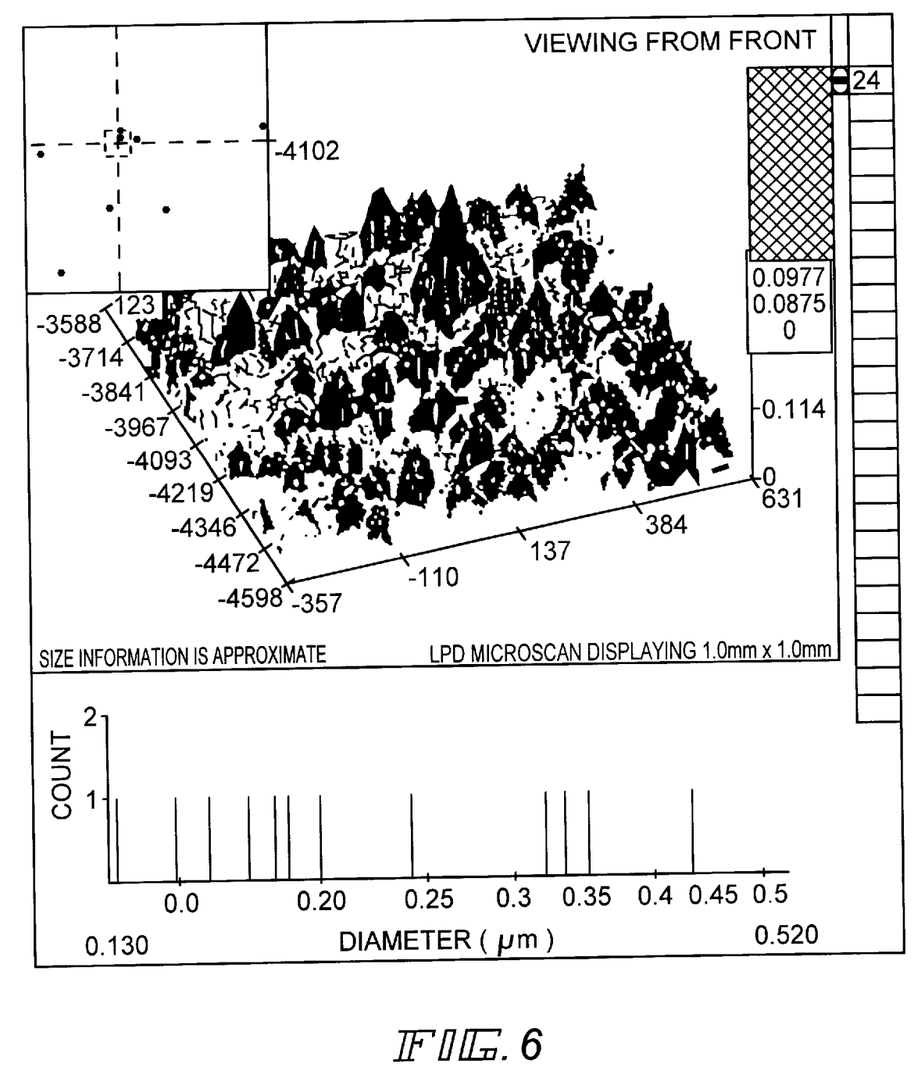
FIG. 6 shows the micro scan image of the surface of the x-ray membrane of Ra=2.0 nm.
Figure 7A:
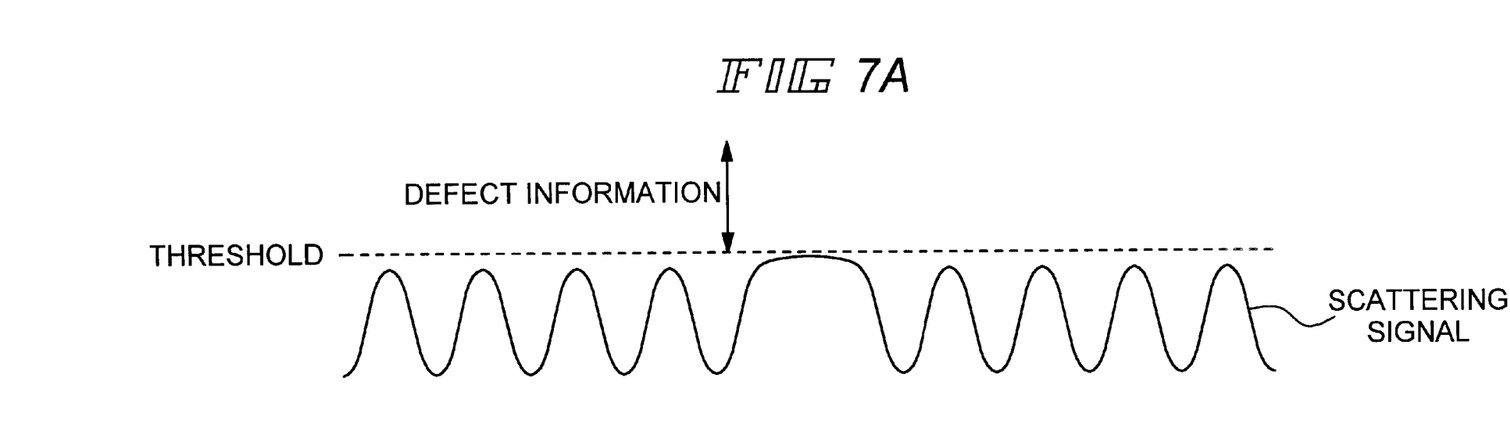
FIG. 7(a) typically shows the micro scan image of the surface of the x-ray membrane of Ra=2.0 nm observed from the just side.
Figure 7B:
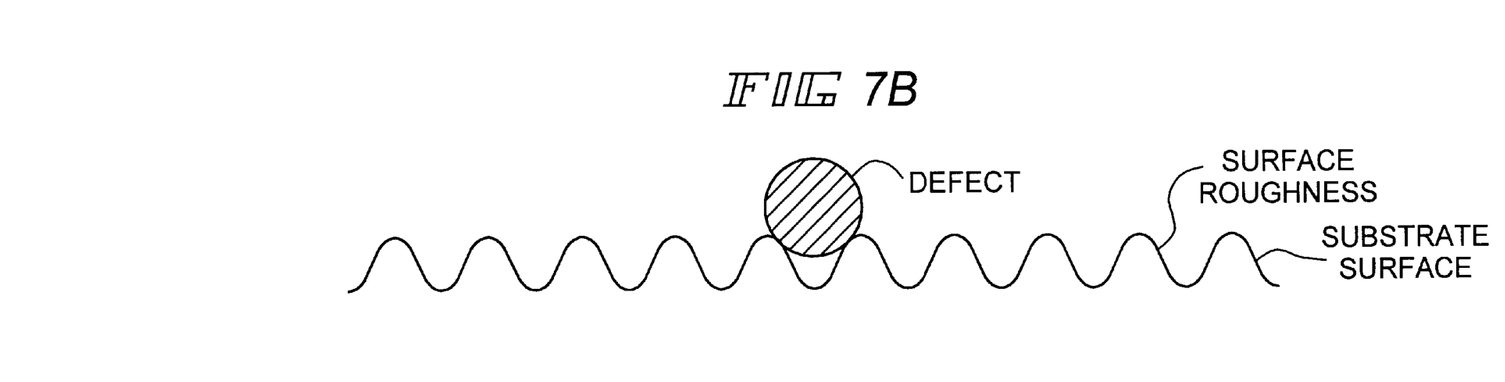
FIG. 7(b) typically shows the cross section of the surface of the x-ray membrane of FIG. 7(a).

FIG. 4 three-dimensionally shows a voltage value in response to a detected light intensity by detecting the light scattered on the surface of the x-ray membrane of 0.5 nm or less in terms of Ra by a photomultiplier (PMT) by the use of Surfscan 6220 (that is, FIG. 4 shows a micro scan image). FIG. 5(a) typically shows the micro scan image observed from the just side. FIG. 5(b) typically shows a cross section of the surface of the x-ray membrane. From these drawings, the defect can be clearly distinguished from a scattering signal on the surface of the x-ray membrane, and the defect of 0.2 $\mu$m in size can be detected.

In the same manner as shown in FIGS. 4 and 5, FIGS. 6 and 7 show a case of the surface of the x-ray membrane of Ra=2.0 nm as a comparison. These drawings show that, since the scattered light is increased due to the roughness of the x-ray membrane and thus the scattered light cannot be distinguished from a defect signal, the defect of 0.2 $\mu$m in size cannot be detected. Preferably, the surface roughness (Ra) of the x-ray membrane is 0.8 nm or less from the same viewpoint. More preferably, the surface roughness is 0.6 nm or less.

The defect checking step of the present invention is not limited to a check of the surface of the x-ray membrane but is adaptable to the check of the surfaces of: the x-ray absorbing film; the thin film such as an etching stop layer, an adhesive layer and a reflection preventing film formed as a sublayer of the x-ray absorbing film; and the thin film such as an etching mask layer formed as a top layer of the x-ray absorbing film, for example. Furthermore, since these thin films are normally formed on the x-ray membrane, the thin films inherit the surface of the x-ray membrane. Therefore, in order that the surface roughness of the surface to be checked by the defect checking step is 1.0 nm or less in terms of Ra (center-line average roughness), this is possible by that the surface roughness of the x-ray membrane is 1.0 nm or less in terms of Ra (center-line average roughness).

More preferably, the surface of the x-ray membrane is flattened in order to obtain the x-ray membrane of 1.0 nm or less in terms of Ra. However, when an etch back method which is one of flattening methods is used, although the roughness of 2 nm or less is obtained, the smooth surface of 1 nm or less can be scarcely obtained. On the other hand, in case of a mechanical polishing method, an abrasive material, an abrasive cloth or other abrasive conditions are controlled, whereby the smooth surface of 1 nm or less can be obtained. The substrate to be herein used is a silicon substrate or the like. SiC, SiN, diamond or the like is used as the x-ray membrane. However, preferably, SiC is used in view of a resistance to x-ray radiation, and thus it is also possible to obtain the flat surface of 1.0 nm or less in terms of Ra.

DESCRIPTION OF THE PREFERRED EMBODIMENTS

A method of manufacturing an x-ray mask blank of an embodiment will be described with reference to FIG. 3.

[Embodiment 1]

[Formation of x-ray membrane]

In the first place, a silicon carbide film is formed as an x-ray membrane 12 on both the surfaces of a silicon substrate 11. The silicon substrate of 4 in. φ in size, of 2 mm in thickness and of a crystalline orientation of (100) is used as the silicon substrate 11. The silicon carbide film as the x-ray membrane is also formed to 2.1 μm in thickness by a CVD process by the use of dichlorosilane and acetylene. Next, the surface of the x-ray membrane 12 is smoothed by a mechanical polishing. The mechanical polishing is performed in the following manner. First, the rear surface of the substrate on which the x-ray membrane 12 is formed is affixed to a stainless (SUS) jig, and the film surface is brought into contact with a solidifying polymer type soft abrasive cloth in which a diamond particle of an average particle diameter of ⅛ μm (0.05–0.35 μm in diameter: Nihon Engis) is dispersed. Then, a load of 200 g/cm² is applied to the jig while the jig is rotated at 60 rpm, whereby the surface is polished for five minutes, so that the surface of a surface roughness of 1 nm or less in terms of Ra is obtained.

[Process of checking the defect on the x-ray membrane]

Next, Surfscan 6220 (KLA-Tencor) is used so as to check whether or not the defect of 0.2 μm or more is detected on the surface of the x-ray membrane obtained by the above-described process. By this check, it is confirmed that 5 defects/cm² or less are detected.

[Formation of x-ray absorbing film]

Figure 3A:
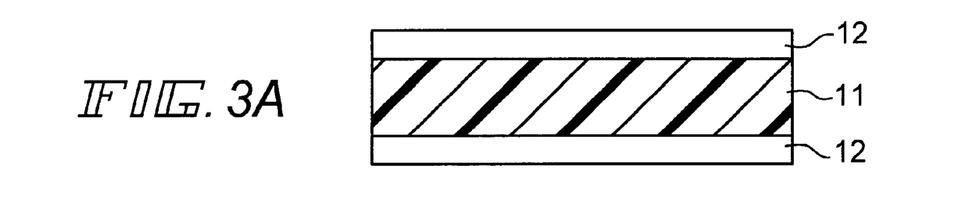
FIG. 3 is an illustration of a method of manufacturing the x-ray mask according to an embodiment of the present invention.
Figure 3B:
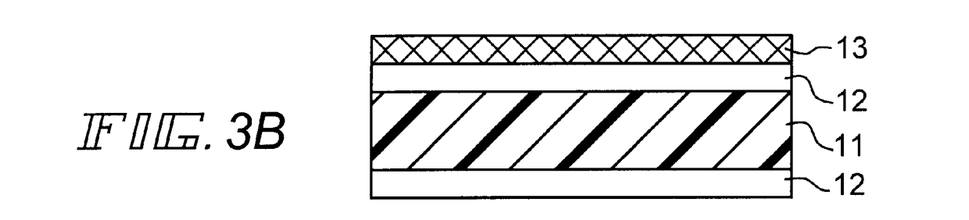

Next, as shown in FIG. 3(B), an x-ray absorbing film 13 of tantalum and boron is formed to 0.5 μm in thickness on the x-ray membrane 12 by a DC magnetron sputtering process. A sintered body containing tantalum and boron in an atomicity ratio (Ta/B) of 8 to 2 is used as a sputter target. Sputter gas is Xe, an RF power density is set at 6.5 W/cm² and a sputter gas pressure is set at 0.35 Pa. Next, this substrate is annealed at 250° C. for two hours in a nitrogen atmosphere so as to thereby obtain the x-ray absorbing film 13 of a low stress of 10 MPa or less.

[Process of checking the defect on the x-ray absorbing film]

Next, Surfscan 6220 (KLA-Tencor) is used so as to check whether or not the defect of 0.2 μm or more is detected on the surface of the x-ray absorbing film obtained by the above-described process. By this check, it can be confirmed that 5 defects/cm² or less are detected. The thus obtained product is also dealt as one type of the x-ray mask blank.

[Formation of etching mask layer]

Figure 3C:
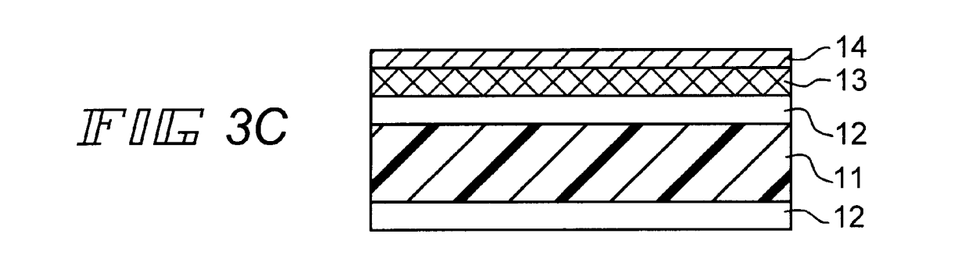
Figure 3D:
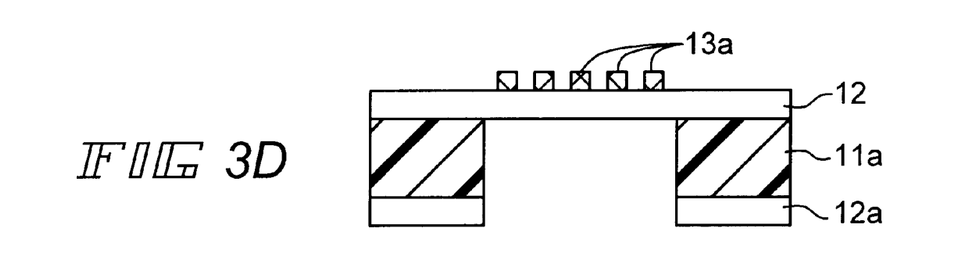

Next, as shown in FIG. 3(C), a chromium film containing chromium carbide is formed as an etching mask layer 14 on the x-ray absorbing film 13 by an RF magnetron sputtering process so that it may be 0.05 μm in thickness. Cr is used as the sputter target, the sputter gas is the gas in which 7% of methane is mixed into Ar, the RF power density is set at 6.5 W/cm² and the sputter gas pressure is set at 1.2 Pa, thereby obtaining the etching mask layer of the low stress of 100 MPa or less. Herein, the etching mask layer is inserted between an EB resist and the x-ray absorbing film, whereby it serves to improve a precision in processing a pattern of the x-ray absorbing film by a dry etching.

[Process of checking the defect on the etching mask layer]

Next, Surfscan 6220 (KLA-Tencor) is used so as to check the defect on the surface of the etching mask layer obtained by the above-described process. By this check, it can be confirmed that the number of the defects of 0.2 μm or more is 5/cm² or less. If the defect is detected, the defect is corrected later (if the number of the defects is 10/cm² or less, the defects can be corrected). The thus obtained product is also dealt as one type of the x-ray mask blank.

[Formation of x-ray absorbing film pattern and Formation of frame body]

A resist film on which a desired pattern is formed is arranged on an x-ray mask blank 2 obtained by the above-mentioned process. This pattern is used as the mask so as to perform the dry etching, whereby the x-ray absorbing film pattern is formed. Then, a center area formed on the rear surface and to be a window area of the x-ray membrane 12 is removed by a reactive ion etching (RIE) by the use of $CF_4$ as etching gas. A remaining film 12a is then used as the mask so as to etch the silicon substrate 11 by an etching liquid constituted of a mixed liquid of fluoric acid and nitric acid, whereby a silicon frame body 11a is formed and the x-ray mask is thus obtained. In this case, an electron beam (EB) resist is generally used as the resist, and the pattern is formed by means of an EB lithography.

According to the x-ray mask manufactured by this embodiment, a pattern defect can be 10 or less after the mask processing, and it is possible to achieve the x-ray mask of no defect by a mask correcting unit. It is also confirmed that a film strength has no problem in practice.

[Embodiment 2]

[Formation of x-ray membrane]

In the first place, the silicon carbide film is formed as the x-ray membrane 12 on both the surfaces of the silicon substrate 11. The silicon substrate of 4 in. φ in size, of 2 mm in thickness and of the crystalline orientation of (100) is used as the silicon substrate 11. The silicon carbide film as the x-ray membrane is also formed to 2.1 μm in thickness by the CVD process by the use of dichlorosilane and acetylene. Next, the surface of the x-ray membrane 12 is smoothed by the mechanical polishing. The mechanical polishing is performed in the following manner. First, the rear surface of the substrate on which the x-ray membrane 12 is formed is affixed to the stainless (SUS) jig, and the film surface is brought into contact with the solidifying polymer type soft abrasive cloth in which the diamond particle of the average particle diameter of ¼ μm (0.1–0.6 μm in diameter: Nihon Engis) is dispersed. Then, the load of 200 g/cm$^2$ is applied to the jig while the jig is rotated at 60 rpm, whereby the surface is polished for five minutes so as to grind the surface by about 0.1 μm in thickness, so that the surface of the surface roughness of 1 nm or less in terms of Ra is obtained. A scratch of 0.2 μm or more is on the surface of the thus obtained film. Therefore, moreover, the rear surface of the substrate is fixed to the SUS jig, and the substrate is brought into contact with a suede type (nonwoven fabric type) abrasive cloth in which colloidal silica (its particle diameter: 60–80 nm) is dispersed. Then, the load of 180 g/cm$^2$ is applied to the jig while the jig is rotated at 60 rpm, whereby the surface is polished for five minutes, so that the scratch is reduced to 0.2 μm or less on the surface.

[Process of checking the defect on the x-ray membrane]

Next, Surfscan 6220 (KLA-Tencor) is used so as to check whether or not the defect of 0.2 μm or more is detected on the surface of the x-ray membrane obtained by the above-described process. By this check, it can be confirmed that 5 defects/cm$^2$ or less are detected. The thus obtained product is also dealt as one type of the x-ray mask blank.

[Formation of x-ray absorbing film]

Next, as shown in FIG. 3(B), the x-ray absorbing film 13 of tantalum and boron is formed to 0.5 μm in thickness on the x-ray membrane 12 by the DC magnetron sputtering process. The sintered body containing tantalum and boron in the atomicity ratio (Ta/B) of 8 to 2 is used as the sputter target. The sputter gas is Xe, the RF power density is set at 6.5 W/cm$^2$ and the sputter gas pressure is set at 0.35 Pa. Next, this substrate is annealed at 250° C. for two hours in the nitrogen atmosphere so as to thereby obtain the x-ray absorbing film 13 of the low stress of 10 MPa or less.

[Process of checking the defect on the x-ray absorbing film]

Next, Surfscan 6220 (KLA-Tencor) is used so as to check whether or not the defect of 0.2 μm or more is detected on the surface of the x-ray absorbing film obtained by the above-described process. By this check, it can be confirmed that 5 defects/cm$^2$ or less are detected. The thus obtained product is also dealt as one type of the x-ray mask blank.

[Formation of etching mask layer]

Next, as shown in FIG. 3(C), the chromium film containing chromium carbide is formed as the etching mask layer 14 on the x-ray absorbing film 13 by the RF magnetron sputtering process so that it may be 0.05 μm in thickness. Cr is used as the sputter target, the sputter gas is the gas in which 7% of methane is mixed into Ar, the RF power density is set at 6.5 W/cm$^2$ and the sputter gas pressure is set at 1.2 Pa, thereby obtaining the etching mask layer of the low stress of 100 MPa or less.

[Process of checking the defect on the etching mask layer]

Next, Surfscan 6220 (KLA-Tencor) is used so as to check whether or not the defect of 0.2 μm or more is detected on the surface of the etching mask layer obtained by the above-described process. By this check, it can be confirmed that 5 defects/cm$^2$ or less are detected. The thus obtained product is also deal t as one type of the x-ray mask blank.

[Formation of x-ray absorbing film pattern and Formation of frame body]

The resist film on which a desired pattern is formed is arranged on the x-ray mask blank 2. This pattern is used as the mask so as to perform the dry etching, whereby the x-ray absorbing film pattern is formed. Then, the center area formed on the rear surface and to be the window area of the x-ray membrane 12 is removed by the reactive ion etching (RIE) by the use of CF$_4$ as the etching gas. The remaining film 12a is then used as the mask so as to etch the silicon substrate 11 by the etching liquid constituted of the mixed liquid of fluoric acid and nitric acid, whereby the x-ray silicon frame body 11a is formed and the x-ray mask is thus obtained (see FIG. 3(D)). In this case, the electron beam (EB) resist is generally used as the resist, and the pattern is formed by means of the EB lithography.

According to the x-ray mask manufactured by this embodiment, the pattern defect can be 10 or less after the mask processing, and it is possible to achieve the x-ray mask of no defect by the mask correcting unit. It is also confirmed that the film strength has no problem in practice.

[Embodiment 3]

This embodiment is the same as the first and second embodiments except that the following mechanochemical polishing is performed as the step of polishing the silicon carbide film which is the x-ray membrane 12 in the step of forming the x-ray membrane 12 in the first and second embodiments.

The mechanochemical polishing of this embodiment is carried out in the following manner. That is, the substrate is brought into contact with the solidifying polymer type abrasive cloth in which the colloidal silica (its particle diameter: 60–80 nm) is dispersed, and then the load of 180 g/cm$^2$ is applied to the substrate while the substrate is rotated at 60 rpm, whereby the surface is polished for ten minutes. At this time, 30% of H$_2$O$_2$ is added into colloidal slurry, whereby pH of solvent medium is changed into weak alkali (8.5). In such a manner, a catalytic action gets active, and thus a polishing speed can be increased and the surface can be smoothed.

COMPARISON EXAMPLE

In this comparison example, the silicon carbide film is formed as the x-ray membrane 12 on both the surfaces of the silicon substrate 11, so that an x-ray mask membrane is made. The silicon substrate of 3 in. φ in size, of 2 mm in thickness and of the crystalline orientation of (100) is used as the silicon substrate 11. The silicon carbide film as the x-ray membrane is also formed to 2 μm in thickness by the CVD process by the use of dichlorosilane and acetylene. The surface roughness (Ra) of the x-ray membrane is 6 nm. Surfscan 6220 (KLA-Tencor) is used so as to check whether or not the defect of 0.2 μm or more is detected on the surface of this x-ray membrane which is not flattened. Consequently, the roughness of the substrate and the defect of 0.8 μm or less cannot be distinguished from each other, and the exact check cannot be performed.

Although a compound of Ta and B (Ta/B=8/2) is used as the x-ray absorbing film in the above-mentioned embodiments, this may be replaced by a metal Ta, an amorphous material containing Ta and tantalum boride having a composition other than $Ta_4B$, for example.

Additionally, a structure of the x-ray mask blank is not only the structure of the embodiments but also the so-called membraned structure in which the x-ray membrane is formed on the substrate and the center is then removed from the rear surface of the substrate so as to form the frame body whereby the x-ray membrane is laminated on this frame body. That is, it may safely be said that a main intermediate product in the step of manufacturing the x-ray mask is the x-ray mask blank.

What is claimed is:

1. A method of manufacturing an x-ray mask blank comprising one step or two steps or more of forming a thin film including at least an x-ray membrane on a substrate, said method comprising the step of:

checking a defect on a surface of said thin film formed by said thin film forming step or steps, wherein said thin film is formed by said thin film forming step or steps so that said thin film checked by said defect checking step may have a surface roughness of 1.0 nm or less in terms of Ra (center-line average roughness).

2. The method according to claim 1, wherein said thin film forming step or steps includes/include a step of flattening the surface of said thin film.

3. The method according to claim 2, wherein said surface flattening step is for polishing the surface of said thin film.

4. The method according to claim 1, wherein said x-ray membrane comprises silicon carbide.

5. The method according to claim 1, wherein said defect checking step is for checking the surface defect by the method using a surface scattering by the use of a laser light.

6. A method of manufacturing an x-ray membrane for an x-ray mask comprising the step of:

checking a defect on a surface of a thin film formed by a step or steps of forming the thin film to be the x-ray membrane, wherein said thin film is formed by said thin film forming step or steps so that said thin film checked by said defect checking step may have a surface roughness of 1.0 nm or less in terms of Ra (center-line average roughness).

* * * * *